United States Patent [19]

Pellegrini

[11] Patent Number: 4,647,791

[45] Date of Patent: Mar. 3, 1987

[54] GENERATOR FOR PRODUCING MULTIPLE SIGNALS WHICH ARE SYNCHRONOUS WITH EACH OTHER

[75] Inventor: Franco Pellegrini, Corsico, Italy

[73] Assignee: SGS-ATES Componenti Elettronici S.p.A., Catania, Italy

[21] Appl. No.: 558,881

[22] Filed: Dec. 7, 1983

[30] Foreign Application Priority Data

Dec. 22, 1982 [IT] Italy ................................ 24906 A/82

[51] Int. Cl.$^4$ ............................................. H03B 19/00
[52] U.S. Cl. .................................... 307/269; 307/244; 307/262; 307/595; 307/513; 328/62; 328/109; 328/29
[58] Field of Search ........... 307/262, 242, 361, 299 A, 307/299 B, 595, 603, 512, 513, 265, 269, 480, 527, 244; 328/109, 60, 62, 29, 34

[56] References Cited

U.S. PATENT DOCUMENTS 3,558,924  1/1971  Lindell .............................. 307/260
4,570,089  2/1986  Nagano ............................. 307/529

Primary Examiner—Stanley D. Miller
Assistant Examiner—Richard Roseen
Attorney, Agent, or Firm—Cushman, Darby & Cushman

[57] ABSTRACT

A voltage comparator with several parallel output channels connected to respective threshold circuits is responsive to the increase of the charge voltage of a capacitor with a linear variation of output currents in the channels. The different output currents, equal or different to each other but all with the same variation rates, are converted into control voltages of the threshold circuits, which are of different value but change with identical rates, so as to reach the threshold value of the respective threshold circuits at different times. From the outputs of the threshold circuits there exit the desired timely connected synchronously related signals, which may be either simple leading or trailing fronts or pulses.

5 Claims, 5 Drawing Figures

GENERATOR FOR PRODUCING MULTIPLE SIGNALS WHICH ARE SYNCHRONOUS WITH EACH OTHER

The present invention relates to a generator for timely connected signals.

In electronics there is very often the necessity to generate signals, which are in very exact time relation with each other.

Many solutions are presently known, everyone with its merits and drawbacks.

The object of the present invention is to realize a generator for timely connected signals, which includes a circuitry particularly simple and limited in its components.

According to the invention such an object is reached by a generator characterized in that it comprises a capacity with associated charge and discharge means for its progressive charge and periodic discharge, a comparator able to compare the charge voltage of said capacity with a reference voltage and to be responsive to the progressive increase of said charge voltage with a linear variation of output currents in a plurality of parallel output channels connected to the control input of respective threshold circuits, and means associated to said parallel channels to convert the respective output currents into a same number of voltages of different value but equally variable, which reach at different times the threshold value of the respective threshold circuits.

In this way it is possible to obtain several output signals (from the several threshold circuits) which are synchronously related to each other in the desired way. In their simplest shape said signals can be constituted by single leading or trailing edges, but it is also possible to provide for the production of pulses of controllable duration, by suitably connecting two by two the threshold circuits (which can be simple transistors). Finally, the generator according to the invention operates as a plurality of monostable multivibrators with different time constants.

In order to obtain these mentioned voltages of different value which are equally variable, there are two possible solutions. One is to realize the comparator so that the several output currents, even changing with the same rate, are all of different value, which can be easily obtained with the known techniques; in such case, resistances of equal value associated to the different parallel channels just give rise to voltages of different value, which however change with the same rate, which is then the same variation rate of the output currents of the comparator. Another solution is on the contrary to make identically variable the output currents of the comparator and to use on the other hand different resistance values for the different parallel channels; the final result is always the same, that is a plurality of voltages of different value, which change with the same linear rate.

The features of the present invention will be made more evident by the following detailed description of an embodiment illustrated by way of non-limitative example in the enclosed drawings, in which FIG. 1 shows the detailed electric diagram of a generator according to the invention;

Figure 1:
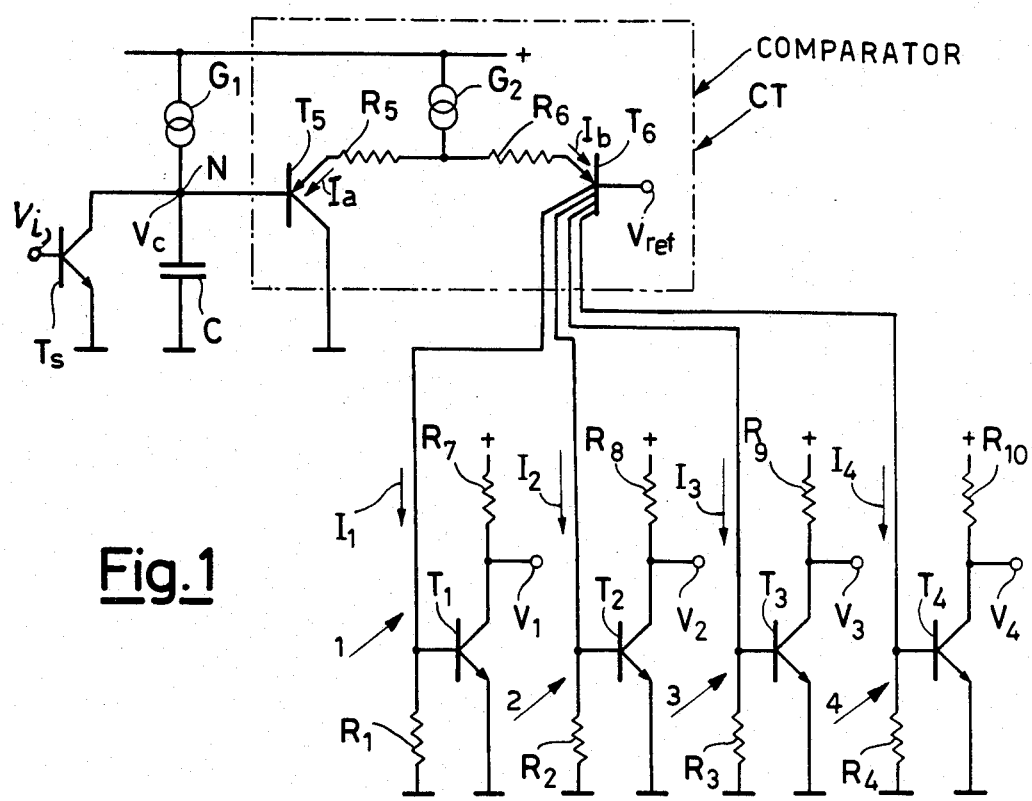

With reference to FIG. 1, there is illustrated a generator according to the invention, which comprises a capacitor C, a charge current generator $G_1$, a discharge transistor (NPN) $T_s$ driven with square-wave input voltage $V_i$, a voltage comparator CT and finally a plurality (in this case, 4) of threshold circuits constituted by a same quantity of transistors (NPN) $T_1$–$T_4$.

The voltage comparator CT comprises a voltage generator $G_2$ and two transistors (PNP) $T_5$ and $T_6$. $T_5$, has the base connected to a node N common to the capacity C, to the charge generator $G_1$ and to the discharge transistor $T_s$, the collector connected to ground and the emitter connected to the generator $G_2$ through a resistance $R_5$. The second transistor, $T_6$, has the base fed with a constant reference voltage $V_{ref}$, the emitter connected to the generator $G_2$ through a resistance $R_6$ equal to $R_5$ and four collectors. From each collector emanates a number of output channel. Each of these channels lead to the control electrode of one of the plural threshold circuit, that is, to the bases of the transistors $T_1$–$T_4$.

These latter transistors have the bases further connected to ground through respective resistances $R_1$–$R_4$, the emitters directly connected to ground and the collectors connected to positive terminals through respective resistances $R_7$–$R_{10}$. From the above mentioned collectors there are obtained output voltages $V_1$–$V_4$ respectively. These signals constitute the synchronized signals produced by the generator.

In operation, the capacitor C is progressively charged by the generator $G_1$, at a progressively increasing charge voltage $V_c$, and is periodically discharged by the transistor $T_s$ when the voltage $V_i$ causes transistor $T_s$ to switch on.

The comparator CT compares the charge voltage $V_c$ with the constant reference voltage $V_{ref}$, thereby causing currents differently divided according to the difference $V_c - V_{ref} = V_d$, or the differential voltage to circulate the transistors $T_5$ and $T_6$. Currents $I_A$ and $I_B$ flow in transistors $T_5$ and $T_6$ respectively.

Figure 2:
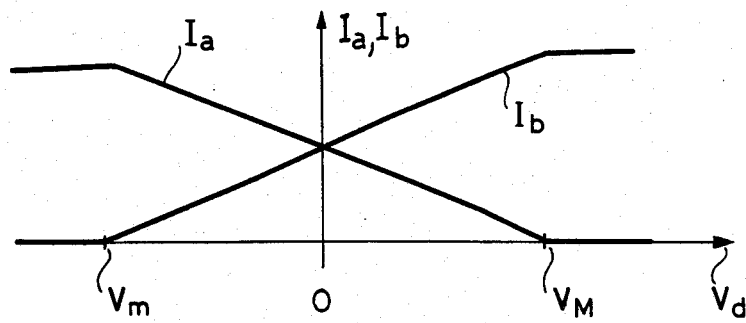
FIG. 2 shows a representative graph of the behaviour of the comparator of the above mentioned generator when the charge voltage of the capacity changes.

The comparator CT is of a general partially known kind, which has the property of including an area, centered around the value $V_d=0$, in which the currents circulating through the transistors $T_5$ and $T_6$ linearly change (in opposite senses) with the voltage $V_d$, that is, being $V_{ref}$ constant, with the charge voltage $V_c$ of the capacity. This is clearly evidenced in FIG. 2, where with $I_a$ and $I_b$ indicate respectively the currents which circulate through $T_5$ and $T_6$, and where $V_M$ and $V_m$ indicate the maximum and the minimum values of $V_d$, which represent the end limits of the linear variation area of the two currents.

By causing the charge voltage $V_c$ to change among such values as to maintain the operation of the comparator CT inside the above mentioned linear variation area, it is possible to obtain from the transistor $T_6$ of the comparator CT for the four parallel channels 1–4, four output currents $I_1$-$I_4$ on the four collectors of $T_6$, which also change linearly as $V_c$.

A suitable choice of the transistor $T_6$, according to well known techniques, allows on the other hand to obtain the one or the other of the following operative conditions: (a) currents $I_1$-$I_4$ values which are different from each other, even if equally linearly variable; (b) currents $I_1$-$I_4$ all of the same value and equally linearly variable.

Figure 3:
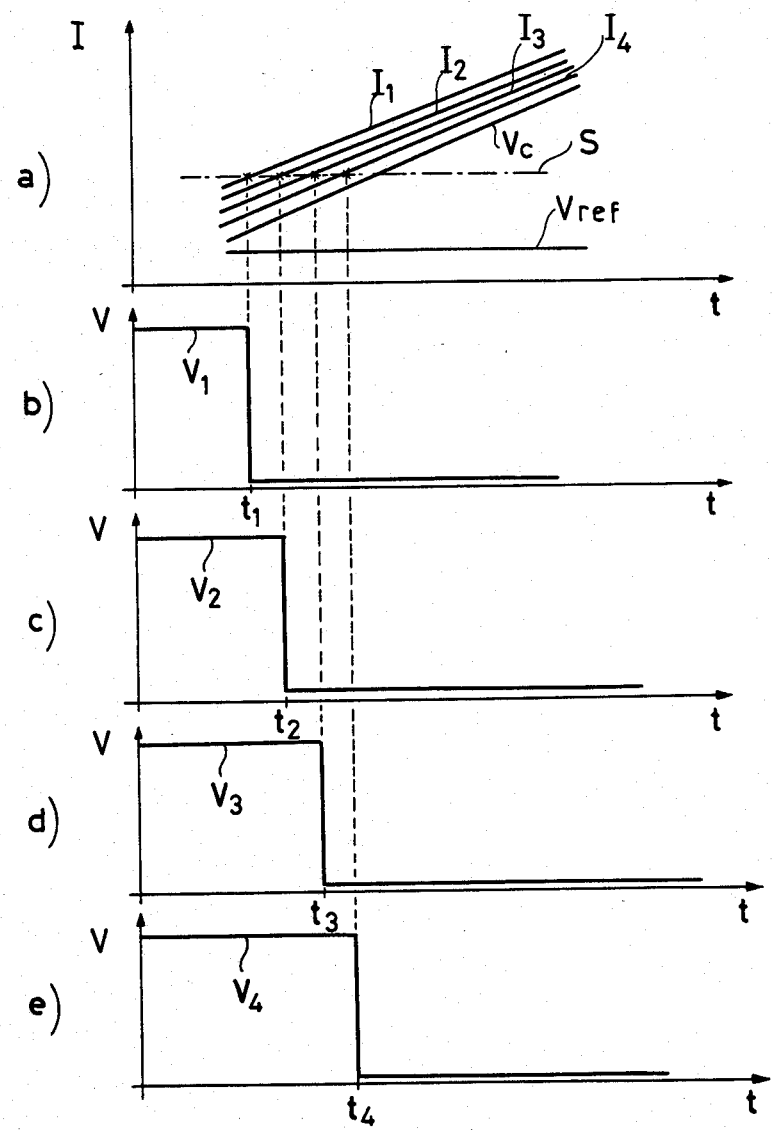
FIG. 3 shows representative graphs of the variation rates of the charge voltage of the capacity and of the output currents of the comparator, as well as of the corresponding timely connected signals produced by the threshold circuits.

The first solution causes the situation represented in the diagram (a) of FIG. 3, that is four different but equally variable currents, which through equal resistances $R_1$-$R_4$ are transformed into respective voltages of different value but equally variable, applied to the bases of the transistors $T_1$-$T_4$. Assuming that all of transistors $T_1$-$T_4$ have the same threshold voltage value S (FIG. 3a), the above mentioned voltages reach the threshold value of the respective transistors $T_1$-$T_4$ at successive and different times $t_1$-$t_4$, thus creating output signals $V_1$-$V_4$ characterized by trailing fronts which are also out of place, as illustrated in the graphs (b), (c), (d), (e) of FIG. 3. Said signals constitute the desired synchronized out of phase output signals, which the generator of FIG. 1 is able to generate.

Figure 4:
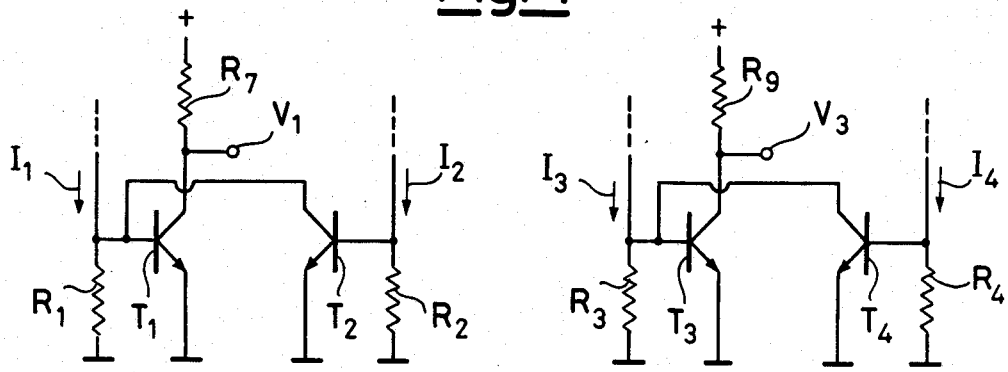
FIG. 4 shows a possible way to interconnect the different threshold circuits in order to obtain pulse signals.
Figure 5:
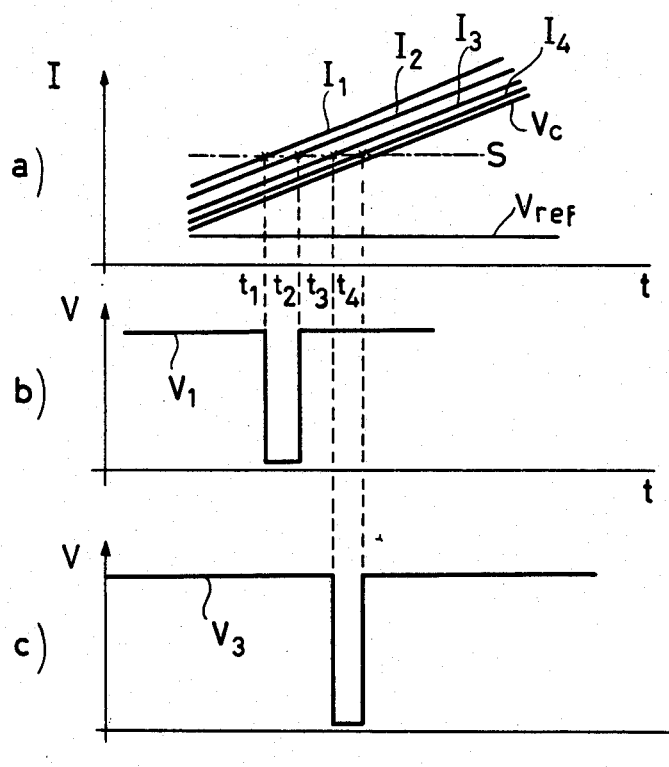
FIG. 5 shows graphs similar to those of FIG. 3, hovewer referred to the use of interconnected threshold circuits as in FIG. 4.

By acting in the same ways, the above mentioned output signals can assume, on the other hand, the shape of pulses which are synchronized and have the desired duration. This is possible by connecting two by two the transistors $T_1$-$T_4$ as shown in FIG. 4, that is by connecting the collector of $T_2$ to the base of $T_1$ and the collector of $T_4$ to the base of $T_3$. There are thus obtained two output signals $V_1$ and $V_3$, whose shape and time location are a consequence of the linear variation of the currents $I_1$-$I_4$. $V_1$ and $V_2$ are clearly represented on the graphs of FIG. 5.

The second previously mentioned solution, that is with $I_1=I_2=I_3=I_4$, requires the choice of different resistance values for the resistances $R_1$ and $R_4$. Thus, these equal currents across resistors of different values will cause different voltages across these resistors. This would result in FIG. 3A showing one linear graph having currents $I_1$, $I_2$, $I_3$ and $I_4$, and four parallel linear graph showing VR1, VR2, VR3 and VR4, respectively representing the voltages across resistors R1 through R4. The graphs of FIGS. 3B through 3E would remain unchanged. In this case, the bases of the transistors $T_1$-$T_4$ have different voltages that are equally increasingly applied. The base voltages reach at different times the threshold voltages of the respective transistors $T_1$-$T_4$ and consequently cause the generation of synchronized out of phase signals as those represented in the graph of FIG. 3 or in those of FIG. 5.

Whatever the chosen solution may be, it is however important that identical thermal conditions are assured for all the resistances $R_1$-$R_4$, as well as for all the transistors $T_1$-$T_4$. Besides, the base current of the transistors $T_5$-$T_6$ must be negligible with respect to $I_1$-$I_4$. In the opposite case, in fact, the desired exact synchronization among the output signals would lack.

I claim:

1. A generator for producing multiple synchronized signals, comprising:
    means for generating a linearly variable voltage;
    a current generator;
    a comparator including first and second differentially connected transistors having common terminals fed by the current generator, a base terminal of said first transistor being coupled to said linearly variable voltage, and a base terminal of said second transistor being coupled to a reference voltage, the second transistor being provided with multiple output terminals;
    a plurality of threshold circuits, each threshold circuit having a control input coupled to one of said multiple output terminals of said second transistor, and
    means coupled to said multiple output terminals of said second transistor for converting respective output currents of said second transistor into an equal number of different, equally variable voltages, each of which reach a threshold value of the respective threshold circuits at different times.

2. A generator as in claim 1 wherein said common terminals of said first and second differentially connected transistors are emitter terminals, and said output terminals are collector terminals.

3. A generator as in claim 1 wherein said common terminals of said first and second transistors are fed by said current generator through resistors of equal value.

4. A generator as in claim 1 wherein said output currents are of different proportional values and said converting means include resistances of equal resistance value.

5. A generator as in claim 1 wherein said output currents are of equal value and said means for converting said output currents into voltages include resistances of different value.

* * * * *